United States Patent
Ho et al.

(10) Patent No.: US 10,090,049 B2
(45) Date of Patent: Oct. 2, 2018

(54) SEMICONDUCTOR INTEGRATED CIRCUIT WITH RESISTIVE CHANGE ELEMENTS INTERSECT WITH FIRST AND SECOND PLURALITY WIRING LINES, CONTROL CIRCUIT AND PLURALITY OF CURRENT LIMITER CIRCUITS CORRESPONDING TO THE FIRST AND SECOND WIRING LINES

(71) Applicant: KABUSHIKI KAISHA TOSHIBA, Tokyo (JP)

(72) Inventors: Yinghao Ho, Kanagawa (JP); Shinichi Yasuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/700,319

(22) Filed: Sep. 11, 2017

(65) Prior Publication Data

US 2018/0151225 A1 May 31, 2018

(30) Foreign Application Priority Data

Nov. 30, 2016 (JP) .................................. 2016-232910

(51) Int. Cl.
*G11C 11/00* (2006.01)
*G11C 13/00* (2006.01)
(Continued)

(52) U.S. Cl.
CPC ...... *G11C 13/0069* (2013.01); *H01L 27/2436* (2013.01); *H01L 27/2463* (2013.01);
(Continued)

(58) Field of Classification Search
CPC ............ G11C 13/0069; H01L 27/2436; H01L 27/2463; H01L 45/1253; H01L 45/146
(Continued)

(56) References Cited

U.S. PATENT DOCUMENTS 8,369,130 B2 * 2/2013 Maejima .................. G11C 8/08
365/148
8,451,648 B2 5/2013 Kamoshida et al.
(Continued)

FOREIGN PATENT DOCUMENTS

JP  2012-022742  2/2012
JP  2016-024841  2/2016
(Continued)

OTHER PUBLICATIONS

Linn el al., "Complementary resistive switches for passive nanocrossbar memories," Nature Materials, vol. 9, pp. 403-406, 2010.

*Primary Examiner* — Connie Yoha
(74) *Attorney, Agent, or Firm* — Finnegan, Henderson, Farabow, Garrett & Dunner, L.L.P.

(57) ABSTRACT

An integrated circuit according to an embodiment includes: resistive change elements disposed in intersection regions between first and second wiring lines; a first driver driving the first wiring lines; a second driver driving the second wiring lines; a control circuit controlling the first and second drivers; first current limiter circuits corresponding to the first wiring lines, each of the first current circuits each limiting a maximum current flowing in corresponding one of the first wiring lines to a value not greater than one of a first to third current values; and second current limiter circuits corresponding to the second wiring lines, the second current limiter circuits each limiting a maximum current flowing in corresponding one of the second wiring lines to a value not greater than one of the first to third current value, the limiting current of the selected element being higher than that of the unselected element.

9 Claims, 11 Drawing Sheets

(51) Int. Cl.
*H01L 27/24* (2006.01)
*H01L 45/00* (2006.01)

(52) U.S. Cl.
CPC ........ *H01L 45/1253* (2013.01); *H01L 45/146* (2013.01); *G11C 2213/79* (2013.01)

(58) Field of Classification Search
USPC ............... 365/148, 185.22, 185.11, 163, 175
See application file for complete search history.

(56) References Cited

U.S. PATENT DOCUMENTS

| | | | |
|---|---|---|---|
| 8,599,600 B2 | 12/2013 | Xi et al. | |
| 9,105,332 B2 * | 8/2015 | Ikeda | ................ G11C 13/0069 |
| 9,601,196 B2 | 3/2017 | Zaitsu | |
| 2011/0216574 A1 * | 9/2011 | Ichihara | ................ G11C 11/00 365/148 |
| 2016/0019959 A1 | 1/2016 | Takagi et al. | |
| 2016/0203860 A1 | 7/2016 | Ho et al. | |

FOREIGN PATENT DOCUMENTS

| | | |
|---|---|---|
| JP | 2016-062627 | 4/2016 |
| JP | 2016-129318 | 7/2016 |

\* cited by examiner

SEMICONDUCTOR INTEGRATED CIRCUIT WITH RESISTIVE CHANGE ELEMENTS INTERSECT WITH FIRST AND SECOND PLURALITY WIRING LINES, CONTROL CIRCUIT AND PLURALITY OF CURRENT LIMITER CIRCUITS CORRESPONDING TO THE FIRST AND SECOND WIRING LINES

CROSS REFERENCE TO RELATED APPLICATIONS

This application is based upon and claims the benefit of priority from the prior Japanese Patent Application No. 2016-232910, filed on Nov. 30, 2016, the entire contents of which are incorporated herein by reference.

FIELD

Embodiments of the present invention relate to semiconductor integrated circuits.

BACKGROUND

A programmable logic device is a semiconductor integrated circuit that can be rewritten after chip manufacturing. A programmable logic device includes wiring lines, and two wiring lines selected from among these wiring lines are electrically connected or unconnected. To perform control so that selected two wiring lines are put into a connected state or an unconnected state, a switching circuit is used, and this switching circuit includes a transistor and a memory. The memory can be electrically programmed, and the transistor is switched on and off in accordance with programmed information.

Meanwhile, cross-point resistive change element arrays are known, and a cross-point resistive change element array includes two-terminal resistive change elements as memory elements and achieves the above switching circuit by using these memory elements. Each of the resistive change elements includes two electrodes and a resistive change layer disposed between the two electrodes.

As a predetermined voltage is applied between the two electrodes, the resistance state of the resistive change layer is changed, and the electrical resistance between the two electrodes can be switched to a low-resistance state or a high-resistance state.

When a resistive change element is programmed, the magnitude of the program voltage to be applied to the electrodes, and the application time of the program voltage need to be appropriately controlled. Further, it is critical to control the magnitude of the current flowing in the resistive change element while the program voltage is applied. Semiconductor integrated circuits including circuits that control currents flowing in resistive change elements during programming as described above are also known.

When a cross-point resistive change element array is programmed, a lower voltage than that of the selected resistive change element is applied to the unselected resistive change elements. This is to protect the unselected resistive change elements from program disturb (set disturb or reset disturb).

Also, a voltage for changing the resistance of a resistive change element varies with the type of the resistive change element, and also varies with the switch cycle or differs between a case where the resistive change element changes from a high-resistance state to a low-resistance state and a case where the resistive change element changes from a low-resistance state to a high-resistance state. Therefore, it is difficult to predict the next voltage for changing resistance while operating. If the variation of the voltage for changing resistance is made wider, program disturb might occur even in a case where a lower voltage than that of the selected resistive change element is applied to the unselected resistive change elements. Any technique for causing no program disturb even when the variation of the voltage for changing the resistance of a resistive change element is made wider is not known at present.

DETAILED DESCRIPTION

Figure 1:
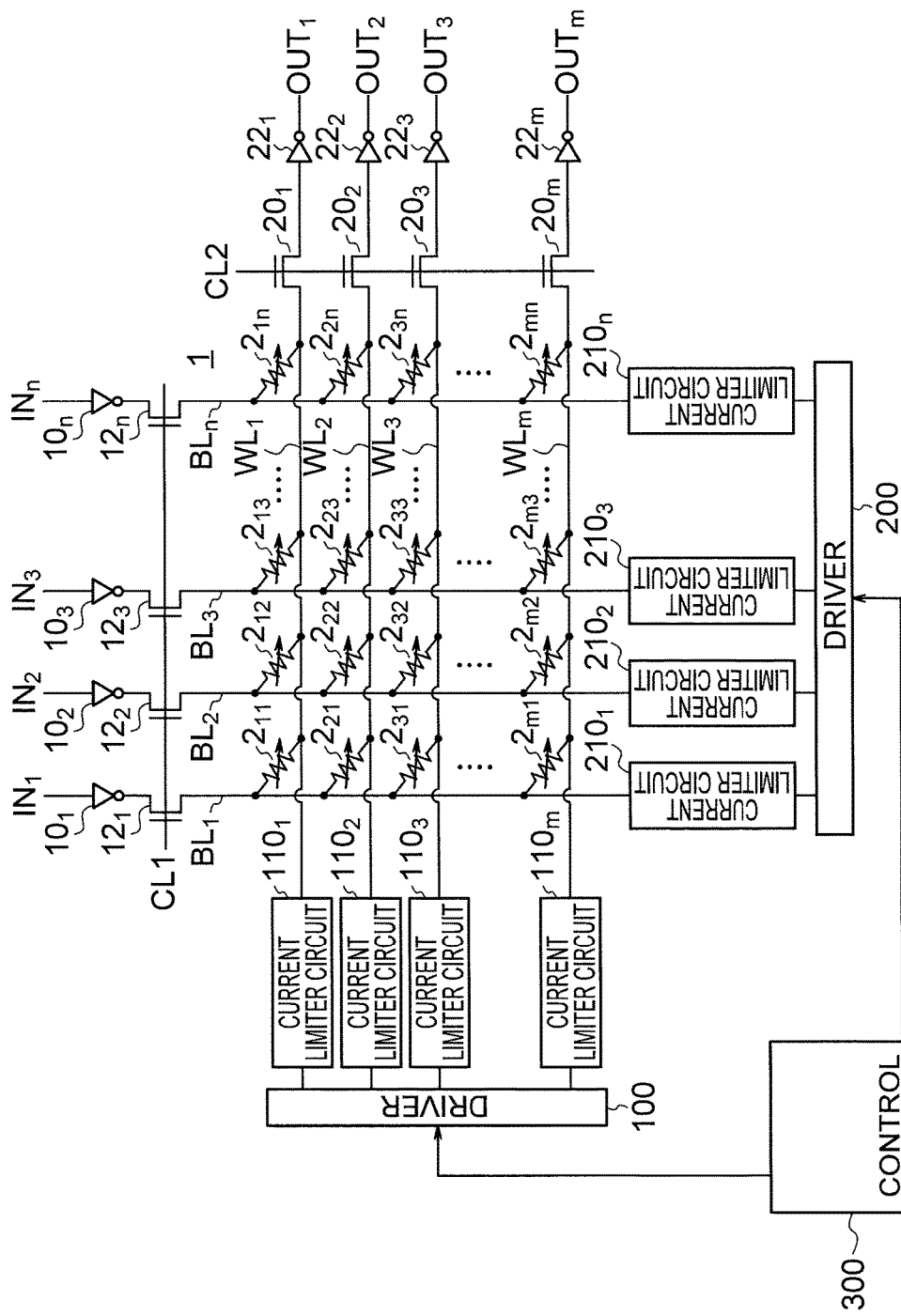
FIG. 1 is a diagram showing a semiconductor integrated circuit according to an embodiment.

An integrated circuit according to an embodiment includes: a plurality of first wiring lines; a plurality of second wiring lines intersecting with the respective first wiring lines; a plurality of resistive change elements disposed in intersection regions between the first wiring lines and the second wiring lines, the resistive change elements each including a first electrode connected to corresponding one of the first wiring lines, a second electrode connected to corresponding one of the second wiring lines, and a resistive change layer disposed between the first electrode and the second electrode, a resistance state between the first electrode and the second electrode being switchable by programming from one of a first resistance state and a second resistance state to the other one of the first resistance state and the second resistance state, the second resistance state having a greater resistance value than the first resistance state; a first driver configured to drive the first wiring lines; a second driver configured to drive the second wiring lines; a control circuit configured to control the first and second drivers; a plurality of first current limiter circuits corresponding to the first wiring lines, each of the first current circuits being configured to limit a maximum current flowing in corresponding one of the first wiring lines to a value not greater than one of a first current value, a second current value, and a third current value in accordance with a control signal from the control circuit, the second current value being greater than the first current value, the third current value being smaller than the first current value; and a plurality of second current limiter circuits corresponding to the second wiring lines, each of the second current limiter circuits being configured to limit a maximum current flowing in corresponding one of the second wiring lines to a value not greater than one of the first current value, the second current value, and the third current value in accordance with a control signal from the control circuit, wherein the control circuit controls the first and second drivers and selects one of the first wiring lines and one of the second wiring lines from among the first and second wiring lines to select one of the resistive change elements corresponding to the one of the first wiring lines and the one of the second wiring lines from the resistive change elements, and, when switching the one of the resistive change elements from the second resistance state to the first resistance state by programming, sends a control signal to the first current limiter circuits to limit a current flowing in the selected first wiring line to a value not greater than the first current value and limit a current flowing in the unselected first wiring lines to a value not greater than the third current value, and sends a control signal to the second current limiter circuits to limit a current flowing in the selected second wiring line to a value not greater than the first current value and limit a current flowing in the unselected second wiring lines to a value not greater than the third current value.

The following is a description of an embodiment, with reference to the accompanying drawings.

Embodiment

A semiconductor integrated circuit according to an embodiment is shown in FIG. 1. The semiconductor integrated circuit of the first embodiment includes: a memory cell array 1 in which (m×n) memory elements $2_{11}$ through $2_{mn}$ are arranged in a matrix form; inverters $10_1$ through $10_n$; cutoff transistors $12_1$ through $12_n$; cutoff transistors $20_1$ through $20_m$; inverters $22_1$ through $22_m$; a driver 100; current limiter circuits $110_1$ through $110_m$; a driver 200; current limiter circuits $210_1$ through $210_n$; and a control circuit 300. The memory cell array 1 further includes word lines $WL_1$ through $WL_m$ and bit lines $BL_1$ through $BL_n$ that intersect with each of the word lines $WL_1$ through $WL_m$.

Each memory element $2_{ij}$ (i=1, . . . , m, j=1, . . . , n) is a two-terminal resistive change element (ReRAM (Resistive random access memory)) that is provided in the cross region of a word line $WL_i$ and a bit line $BL_j$. Each memory element (hereinafter also referred to as a resistive change element) $2_{ij}$ (i=1, . . . , m, j=1, . . . , n) has one terminal connected to the corresponding word line $WL_i$ and has the other terminal connected to the corresponding bit line $BL_j$.

Figure 2:
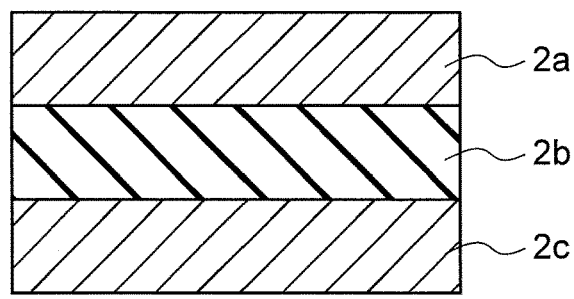
FIG. 2 is a cross-sectional view of a resistive change element.

FIG. 2 shows an example of each resistive change element $2_{ij}$ (i=1, . . . , m, j=1, . . . , n). This resistive change element 2 includes an upper electrode 2a, a lower electrode 2c, and a resistive change layer 2b provided between the upper electrode 2a and the lower electrode 2c.

The resistive change layer 2b may be a metal oxide such as a titanium oxide, a hafnium oxide, a tantalum oxide, or an aluminum oxide, or may be a metal oxynitride such as a titanium oxynitride, a hafnium oxynitride, a tantalum oxynitride, or an aluminum oxynitride. Alternatively, the resistive change layer 2b may be a semiconductor oxide such as a silicon oxide, a semiconductor nitride such as a silicon nitride, or a semiconductor oxynitride such as a silicon oxynitride. The resistive change layer 2b may be a semiconductor material such as amorphous silicon. The resistive change layer 2b may be a film formed by stacking the above materials.

In the resistive change element 2, a predetermined voltage is applied to the electrodes 2a and 2c, so that the electrical resistance between the electrodes can be changed. Here, changing the resistance of the resistive change element 2 from a high-resistance state to a low-resistance state is referred to as "setting", and changing the resistance of the resistive change element 2 from a low-resistance state to a high-resistance state is referred to as "resetting". The voltage necessary for setting the resistive change element 2 is referred to as the "set voltage", and the voltage necessary for resetting the resistive change element 2 is referred to as the "reset voltage".

Example types of resistive change elements 2 include a unipolar resistive change element and a bipolar resistive change element. In a unipolar resistive change element, the polarities of the set voltage and the reset voltage are the same. If a higher voltage than the voltage to be applied to the electrode 2a is applied to the electrode 2c to set the resistive change element 2, for example, a higher voltage than the voltage to be applied to the electrode 2a is also applied to the electrode 2c to reset the resistive change element 2. In a bipolar resistive change element, on the other hand, the polarities of the set voltage and the reset voltage are different from each other. If a higher voltage than the voltage to be applied to the electrode 2a is applied to the electrode 2c to set the resistive change element 2, for example, a lower voltage than the voltage to be applied to the electrode 2a is applied to the electrode 2c to reset the resistive change element 2. It should be noted that unipolar resistive change elements are used in the semiconductor integrated circuit of this embodiment.

Figure 3:
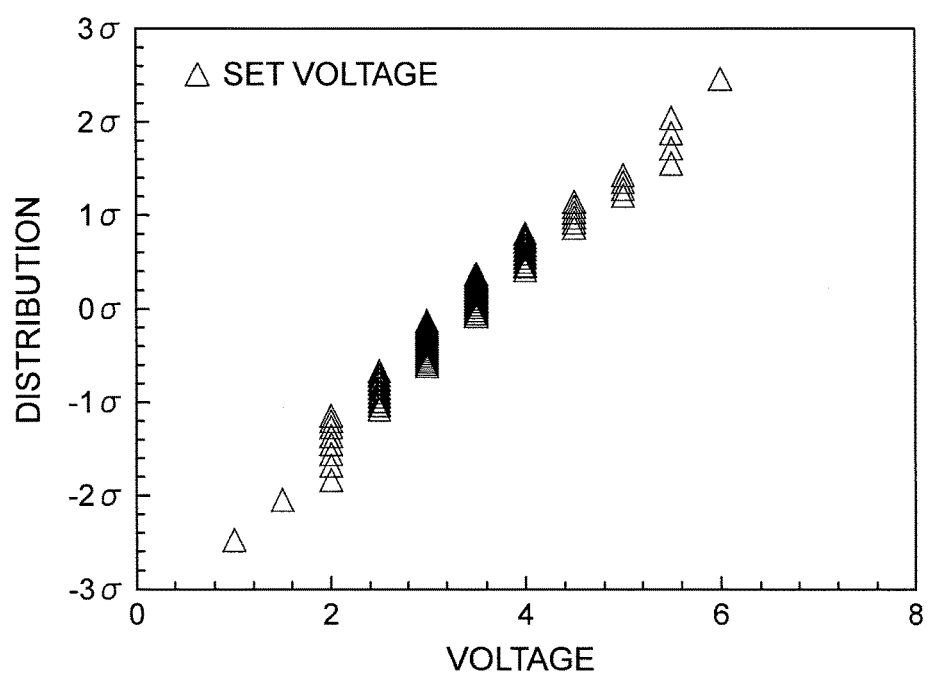
FIG. 3 is a graph showing variation of the set voltage of a resistive change element.

Each resistive change element 2 used in the semiconductor integrated circuit of this embodiment preferably has a large difference between the resistance value in a high-resistance state and the resistance value in a low-resistance state. For example, the resistance value in a high-resistance state is preferably 1 GΩ, and the resistance value in a low-resistance state is preferably 10 KΩ. However, a resistive change element that has 1 GΩ as the resistance value in a high-resistance state has large set voltage variation. This is now explained with reference to FIG. 3. FIG. 3 is a diagram showing measurement results in a case where a set operation and a reset operation were repeatedly performed on one resistive change element, and the set voltage was measured. In FIG. 3, the abscissa axis indicates applied voltage, and the ordinate axis indicates multiples of deviation (σ) representing the levels of variation of the set voltage. The applied voltage was changed from 1 V to 6 V, with 0.5 V increments in between. As can be seen from FIG. 3, the variation of the set voltage is large. Therefore, even in a case where a write inhibition voltage Vinh (half the program voltage (write voltage) Vpgm, for example) is applied to unselected resistive change elements in the memory array of the semiconductor integrated circuit shown in FIG. 1, a wrong set operation might be performed. This hinders the use of a conventional write method.

Referring back to FIG. 1, the semiconductor integrated circuit of this embodiment is described. Each word line $WL_i$ (i=1, . . . , m) has one end connected to the driver 100 via the current limiter circuit $110_i$, and has the other end connected to the input terminal of the inverter $22_i$ via the cutoff transistor $20_i$. The gate of each cutoff transistor $20_i$ (i=1, . . . , m) is connected to a control line CL2. An output signal $OUT_i$ is output from the output terminal of each inverter $22_i$ (i=1, . . . , m).

Each bit line $BL_j$ (j=1, . . . , n) has one end connected to the output terminal of the inverter $10_j$ via the cutoff transistor $12_j$, and has the other end connected to the driver 200 via the current limiter circuit $210_j$. The gate of each cutoff transistor $12_j$ (j=1, . . . , n) is connected to a control line CL1. An input signal $IN_j$ is input to the input terminal of each inverter 10 (j=1, . . . , n).

The control circuit 300 applies a voltage to the word lines $WL_1$ through $WL_m$ via the driver 100 and the current limiter circuits $110_1$ through $110_m$, and applies a voltage to the bit lines $BL_1$ through $BL_n$ via the driver 200 and the current limiter circuits $210_1$ through $210_n$.

When applying the set voltage or the reset voltage to the resistive change elements $2_{i1}$ through $2_{in}$ connected to a word line $WL_i$, the current limiter circuit $110_i$ (i=1, . . . , m) limits the current flowing in the resistive change elements $2_{i1}$ through $2_{in}$ during programming to a certain value (a limited current value) or lower, so as to reduce variation of the resistance values of the resistive change elements $2_{i1}$ through $2_{in}$ after the programming, or to prevent irreversible destruction of the resistive change elements $2_{i1}$ through $2_{in}$.

When applying the set voltage or the reset voltage to the resistive change elements $2_{1j}$ through $2_{mj}$ connected to a bit line $BL_j$, the current limiter circuit $210_j$ (j=1, . . . , n) limits the current flowing in the resistive change elements $2_{1j}$ through $2_{mj}$ during programming to a certain value (a limited current value) or lower, so as to reduce variation of the resistance values of the resistive change elements $2_{1j}$ through $2_{mj}$ after the programming, or to prevent irreversible destruction of the resistive change elements $2_{1j}$ through $2_{mj}$.

For example, if the limited current value at the time of setting is made greater, the resistance value of each resistive change element after the setting normally becomes smaller. At the time of resetting, on the other hand, the limited current value is made sufficiently greater, so that a sufficiently large amount of current is applied to the resistive change element, and the heat generated at this point switches the resistance state of the resistive change element to a high-resistance state. In this manner, different limited current values are used at the time of setting and at the time of resetting.

First Specific Example of Current Limiter Circuits

Figure 4:
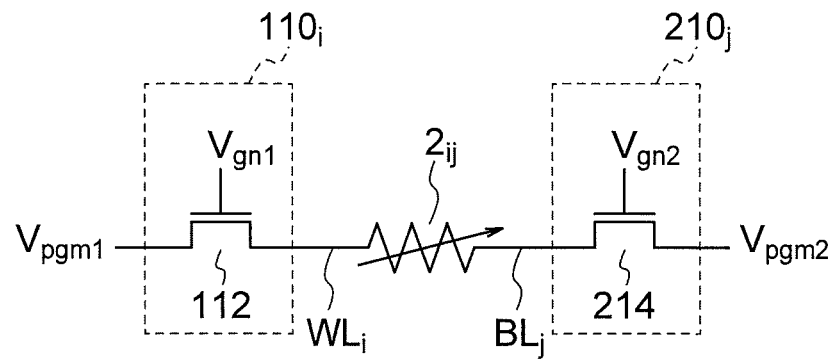
FIG. 4 is a circuit diagram showing a first specific example of current limiter circuits.

FIG. 4 shows a first specific example of current limiter circuits. In the first specific example and the later specific examples, a current limiter circuit $110_i$ (i=1, . . . , m) and a current limiter circuit $210_j$ (j=1, . . . , n) are connected to each other via a resistive change element $2_{ij}$.

As shown in FIG. 4, the current limiter circuit $110_i$ (i=1, . . . , m) includes an n-channel transistor 112. One terminal of the source and the drain of the transistor 112 is connected to the output terminal of the driver 100 (see FIG. 1), and a program voltage Vpgm1 is applied to the one terminal. The other terminal is connected to one of the two terminals of the resistive change element $2_{ij}$. As a control voltage Vgn1 is applied to the gate of the transistor 112, and the control voltage Vgn1 is controlled, the maximum current (the limited current value) to pass through the transistor 112 can be changed. That is, it is possible to obtain multiple limited current values, such as three limited current values, by controlling the control voltage Vgn1.

As shown in FIG. 4, the current limiter circuit $210_j$ (j=1, . . . , m) of the first specific example includes an n-channel transistor 214. One terminal of the source and the drain of the transistor 214 is connected to the other one of the two terminals of the resistive change element $2_{ij}$ via the bit line $BL_j$ (j=1, . . . , n). The other terminal of the transistor 214 is connected to the output terminal of the driver 200 (see FIG. 1), and a program voltage Vpgm2 is applied to the other terminal. A control voltage Vgn2 is applied to the gate of the transistor 214. As the control voltage Vgn2 is applied to the gate of the transistor 214, and the control voltage Vgn2 is controlled, the maximum current (the limited current value) to pass through the transistor 214 can be changed. That is, it is possible to obtain multiple limited current values, such as three limited current values, by controlling the control voltage Vgn2. It should be noted that the program voltage Vpgm1 may be higher than the program voltage Vpgm2. In that case, the control voltages Vgn1 and Vgn2 are higher than the program voltage Vpgm1. Alternatively, the program voltage Vpgm1 may be lower than the program voltage Vpgm2. In that case, the control voltages Vgn1 and Vgn2 are higher than the program voltage Vpgm2.

Second Specific Example of Current Limiter Circuits

Figure 5:
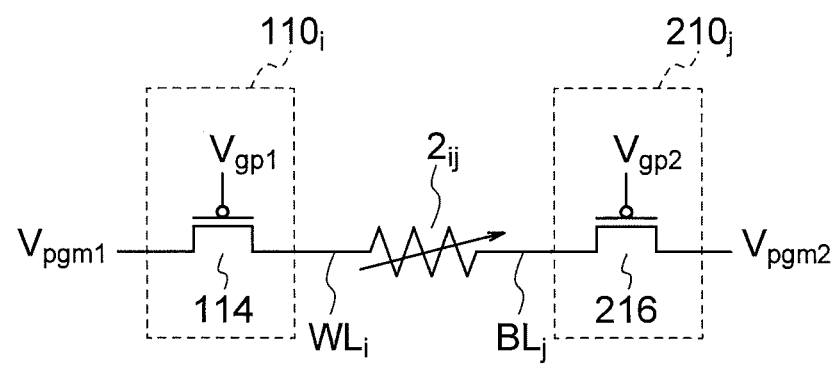
FIG. 5 is a circuit diagram showing a second specific example of current limiter circuits.

FIG. 5 shows a current limiter circuit $110_i$ (i=1, . . . , m) and a current limiter circuit $210_j$ (j=1, . . . , n) of a second specific example. The current limiter circuit $110_i$ (i=1, . . . , m) of the second specific example is the same as the current limiter circuit $110_i$ of the first specific example shown in FIG. 4, except that the n-channel transistor 112 is replaced with a p-channel transistor 114.

A control voltage Vgp1 is applied to the gate of the transistor 114. The transistor 114 can obtain multiple limited current values, such as three limited current values, by controlling the control voltage Vgp1.

The current limiter circuit $210_j$ (j=1, . . . , n) of the second specific example is the same as the current limiter circuit $210_j$ of the first specific example shown in FIG. 4, except that the n-channel transistor 214 is replaced with a p-channel transistor 216. A control voltage Vgp2 is applied to the gate of the transistor 216. The transistor 216 can obtain multiple limited current values, such as three limited current values, by controlling the control voltage Vgp2.

In the second specific example, the program voltage Vpgm1 may be higher than the program voltage Vpgm2. In that case, the control voltages Vgp1 and Vgp2 are lower than the program voltage Vpgm2. Alternatively, the program voltage Vpgm1 may be lower than the program voltage Vpgm2. In that case, the control voltages Vgp1 and Vgp2 are lower than the program voltage Vpgm1.

Third Specific Example of Current Limiter Circuits

Figure 6:
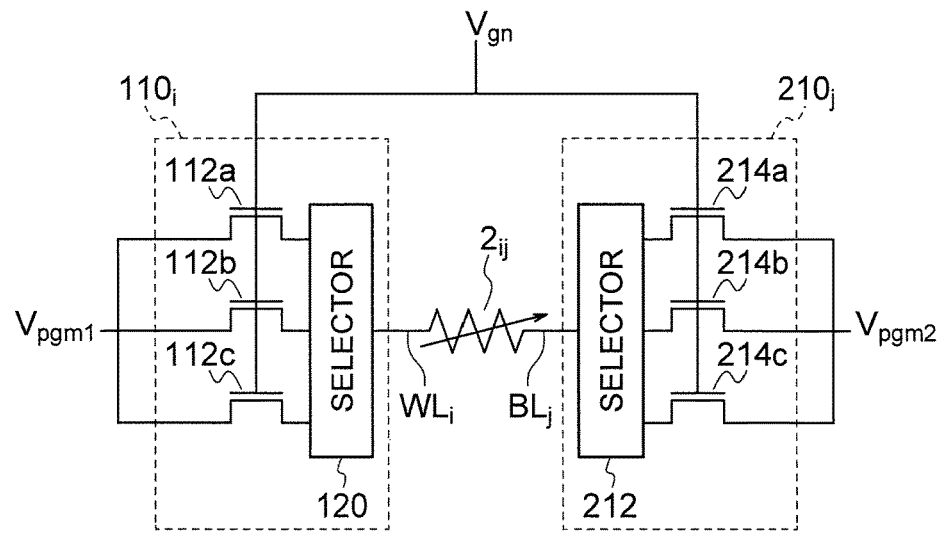
FIG. 6 is a circuit diagram showing a third specific example of current limiter circuits.

FIG. 6 shows a third specific example of a current limiter circuit $110_i$ (i=1, . . . , m) and a current limiter circuit $210_j$ (j=1, . . . , n). The current limiter circuit $110_i$ (i=1, . . . , m) of the third specific example includes three n-channel transistors 112a, 112b, and 112c connected in parallel, and a selector 120. A control voltage Vgn is applied to each of the gates of the n-channel transistors 112a, 112b, and 112c connected in parallel.

In the current limiter circuit $110_i$ (i=1, . . . , m), a program voltage Vpgm1 is applied to one terminal (one terminal of the source and the drain) of each of the n-channel transistors 112a, 112b, and 112c, and the other terminal (the other terminal of the source and the drain) of each of the n-channel transistors 112a, 112b, and 112c is connected to the input terminal of the selector 120. In the current limiter circuit $110_i$ (i=1, . . . , m), the output terminal of the selector 120 is connected to one of the two terminals of the resistive change element $2_{ij}$ (j=1, . . . , n) via the word line $WL_i$.

One of the three transistors 112a, 112b, and 112c is selected by the selector 120. This selection is made in accordance with a select signal supplied from the control circuit 300 shown in FIG. 1. The three transistors 112a, 112b, and 112c are designed so that the respective driving forces differ from one another, and, when the same voltage is applied to the respective gates, different currents flow between the sources and the drains. That is, as the control voltage Vgn is applied to each of the three transistors 112a, 112b, and 112c, the maximum currents (the limited current values) to flow in the respective transistors 112a, 112b, and 112c are controlled. Specifically, the three transistors 112a, 112b, and 112c are manufactured so that at least one of the channel width, the gate length, the thickness of the gate insulating film, and the impurity concentration in the channel varies among the three transistors 112a, 112b, and 112c.

The current limiter circuit $210_j$ (j=1, . . . , n) of the third specific example includes a selector 212 and three n-channel transistors 214a, 214b, and 214c connected in parallel. The control voltage Vgn is applied to each of the gates of the n-channel transistors 214a, 214b, and 214c connected in parallel. The input terminal of the selector 212 is connected to the other one of the two terminals of the resistive change element $2_{ij}$ ((i=1, . . . , m), and the output terminal of the selector 212 is connected to one terminal (one terminal of the source and the drain) of each of the n-channel transistors 214a, 214b, and 214c. A program voltage Vpgm2 (<Vpgm1) is applied to the other terminal (the other terminal of the source and the drain) of each of the n-channel transistors 214a, 214b, and 214c. The control voltage Vgn is higher than the program voltage Vpgm1. Alternatively, the program voltage Vpgm2 may be higher than the program voltage Vpgm1. In that case, the control voltage Vgn is a higher voltage than the program voltage Vpgm2, and is such a voltage that the transistors 214a, 214b, and 214c enter an on-state.

One of the three transistors 214a, 214b, and 214c is selected by the selector 212. The three transistors 214a, 214b, and 214c are designed so that the respective driving forces differ from one another, and, when the same voltage is applied to the respective gates, different currents flow between the sources and the drains. That is, as the control voltage Vgn is applied to each of the three transistors 214a, 214b, and 214c, the maximum currents (the limited current values) to flow in the respective transistors 214a, 214b, and 214c are controlled.

Fourth Specific Example of Current Limiter Circuits

Figure 7:
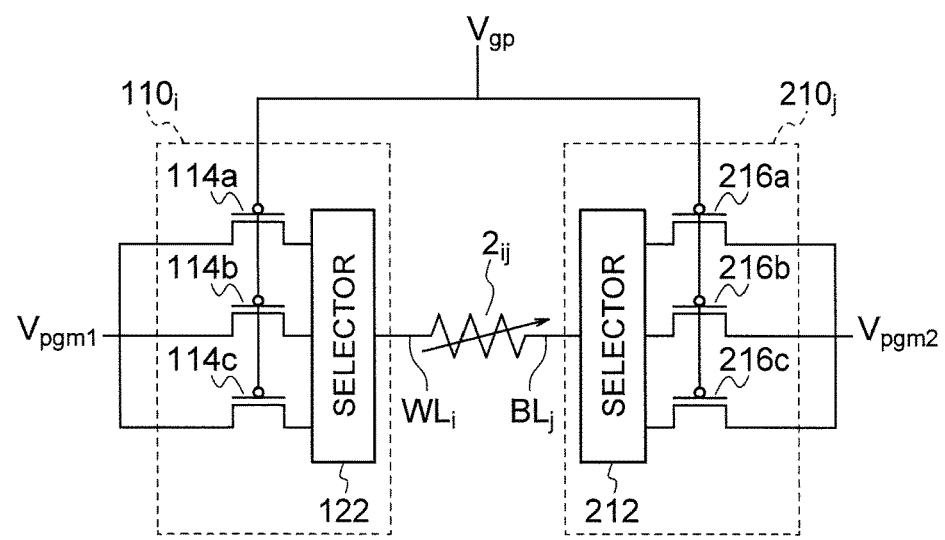
FIG. 7 is a circuit diagram showing a fourth specific example of current limiter circuits.

FIG. 7 shows a current limiter circuit $110_i$ (i=1, . . . , m) and a current limiter circuit $210_j$ (j=1, . . . , n) of a fourth specific example. The current limiter circuit $110_i$ (i=1, . . . , m) of the fourth specific example is the same as the current limiter circuit $110_i$ of the third specific example shown in FIG. 6, except that the n-channel transistors 112a, 112b, and 112c are replaced with p-channel transistors 114a, 114b, and 114c, respectively.

Specifically, the current limiter circuit $110_i$ (i=1, . . . , m) of the fourth specific example includes three p-channel transistors 114a, 114b, and 114c connected in parallel, and a selector 122. A control voltage Vgp is applied to each of the gates of the p-channel transistors 114a, 114b, and 114c connected in parallel. In the current limiter circuit $110_i$ (i=1, . . . , m) of the fourth specific example, a program voltage Vpgm1 is applied to one terminal (one terminal of the source and the drain) of each of the p-channel transistors 114a, 114b, and 114c, and the other terminal (the other terminal of the source and the drain) of each of the p-channel transistors 114a, 114b, and 114c is connected to the input terminal of the selector 122. In the current limiter circuit $110_i$ (i=1, . . . , m), the output terminal of the selector 122 is connected to one of the two terminals of the resistive change element $2_{ij}$ (j=1, . . . , n) via the word line $WL_i$.

One of the three transistors 114a, 114b, and 114c is selected by the selector 122. The three transistors 114a, 114b, and 114c are designed so that the respective driving forces differ from one another, and, when the same voltage is applied to the respective gates, different currents flow between the sources and the drains. That is, the maximum currents (the limited current values) to pass through the three transistors 114a, 114b, and 114c differ from one another. Specifically, the transistors 114a, 114b, and 114c are manufactured so that at least one of the channel width, the gate length, the thickness of the gate insulating film, and the impurity concentration in the channel varies among the transistors 114a, 114b, and 114c.

The current limiter circuit $210_j$ (j=1, . . . , n) of the fourth specific example includes a selector 212 and three p-channel transistors 216a, 216b, and 216c connected in parallel. The control voltage Vgp is applied to each of the gates of the p-channel transistors 216a, 216b, and 216c connected in parallel. The input terminal of the selector 212 is connected to the other one of the two terminals of the resistive change element $2_{ij}$ ((i=1, . . . , m), and the output terminal of the selector 212 is connected to one terminal (one terminal of the source and the drain) of each of the p-channel transistors 216a, 216b, and 216c. A program voltage Vpgm2 (<Vpgm1) is applied to the other terminal (the other terminal of the source and the drain) of each of the p-channel transistors 216a, 216b, and 216c. The control voltage Vgp is a lower voltage than the program voltage Vpgm2, and is such a voltage that the transistors 216a, 216b, and 216c enter an on-state.

One of the three transistors 216a, 216b, and 216c is selected by the selector 212. This selection is made in accordance with a select signal supplied from the control circuit 300 shown in FIG. 1. The three transistors 216a, 216b, and 216c are designed so that the respective driving forces differ from one another, and, when the control voltage Vgp is applied to the respective gates, the maximum currents (the limited current values) to flow between the sources and the drains differ from one another. That is, the limited current values to pass through the three transistors 216a, 216b, and 216c differ from one another.

Figure 8:
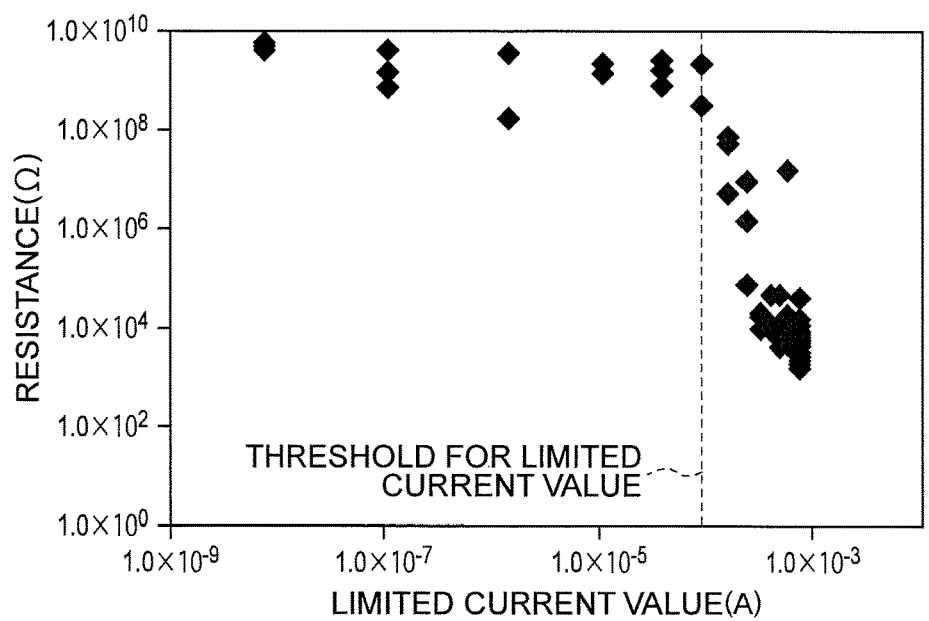
FIG. 8 is a graph showing the results of measurement of the resistance value of a resistive change element after a set operation, with different limited current values flowing in the resistive change element.

Referring now to FIG. 8, the limited current value dependence of the resistance value during a set operation of a resistive change element is described.

FIG. 8 is a graph showing the results of measurement of the resistance value of a resistive change element after a set operation that was performed with different limited current values flowing in the single resistive change element, and a set voltage applied between the two terminals of the resistive change element.

As can be seen from FIG. 8, where the limited current value is equal to or lower than the threshold, the resistance value after the set operation hardly varies. Where the limited current value is higher than the threshold, however, the resistance value after the set operation decreases with increase of the limited current value. Therefore, the resistance value after the set operation is affected by the magnitude of the threshold for the limited current value.

Figure 9:
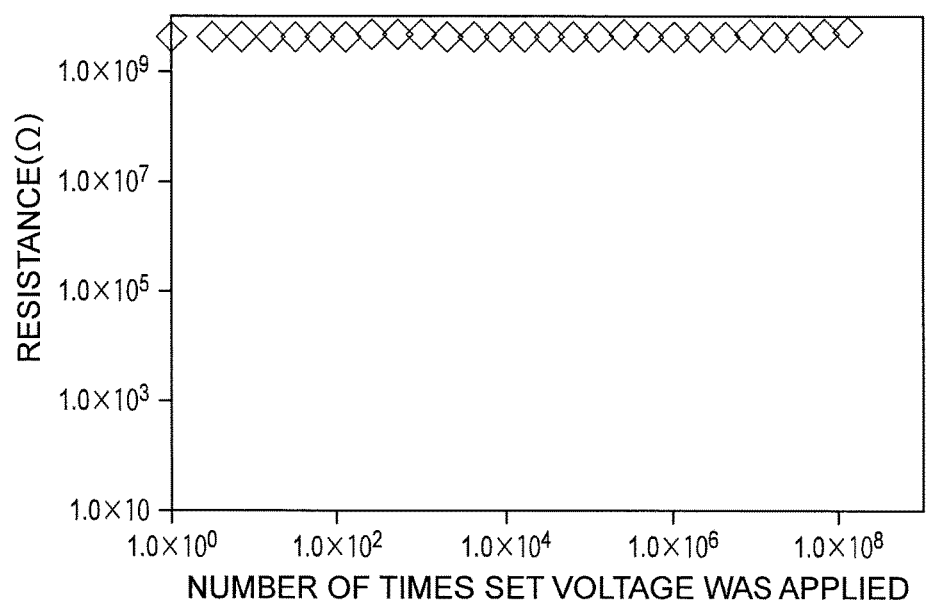
FIG. 9 is a graph showing the results of measurement of the resistance value of a resistive change element in a case where a set voltage was applied more than once, with limited currents not higher than a threshold flowing in the resistive change element.

FIG. 9 shows the results of measurement of the resistance value of a resistive change element in a case where a limited current equal to or lower than the threshold, such as 100 nA, was applied to the single resistive change element, and the set voltage, such as 6 V, was applied to the two terminals of the resistive change element one to $10^8$ times. As can be seen from FIG. 9, where the limited current value is equal to or lower than the threshold, the possibility that an unselected element is wrongly set is low. In view of this, a method by which the limited current is lowered to a value equal to or lower than the threshold is highly reliable as a measure against wrong setting.

(Write Operation)

Referring now to FIGS. 10 through 15, a write operation to be performed on a resistive change element in the semiconductor integrated circuit of this embodiment is described. In a write operation according to this embodiment, the current limiter circuits 110$_1$ through 110$_m$ and the current limiter circuits 210$_1$ through 210$_n$ each has a first current value Icomp1, a second current value Icomp2 (>Icomp1), and a third current value Icomp3 (<Icomp1) as the limited current values. The third current value Icomp3 is set at a value equal to or lower than the threshold described with reference to FIG. 8, and the second current value Icomp2 and the first current value Icomp1 are set at higher values than the threshold. In a case where a write operation is performed, the cutoff transistors 12$_1$ through 12$_n$ are put into an off-state by a control signal CL1, and the cutoff transistors 20$_1$ through 20$_m$ are put into an off-state by a control signal CL2.

(Set Operation)

Figure 10:
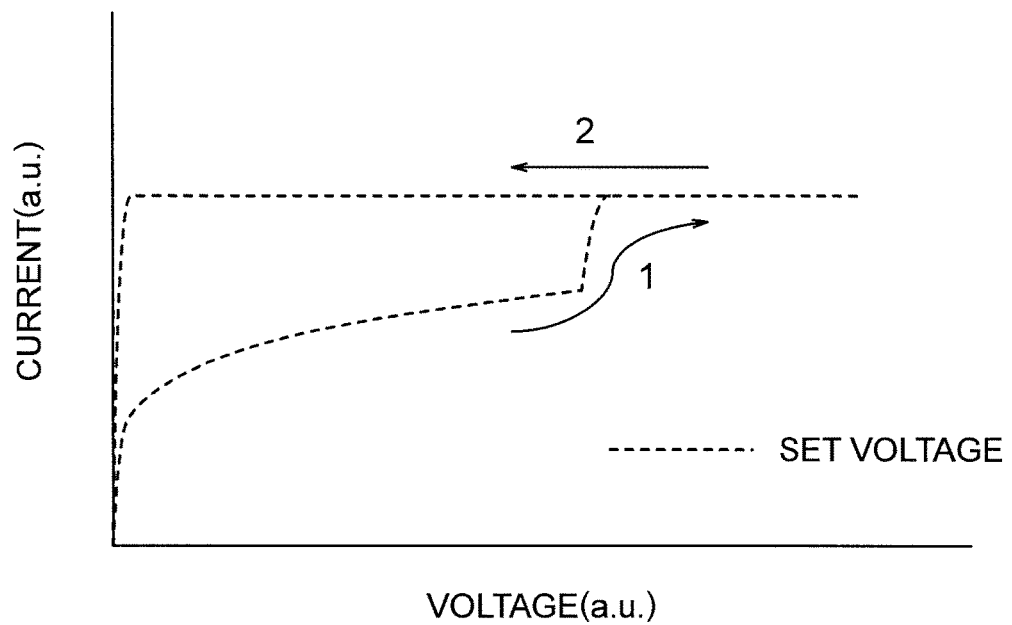
FIG. 10 is a graph showing the current-voltage characteristics at a time of a set operation on a resistive change element.

Referring now to FIGS. 10 through 13, a set operation is described. FIG. 10 shows the current-voltage characteristics at a time of a set operation on a resistive change element. As the voltage to be applied to the resistive change element is made higher, the current flowing in the resistive change element at a predetermined voltage becomes rapidly higher. After that, the current flowing in the resistive change element is maintained at a high state even if the voltage to be applied is lowered.

Figure 11:
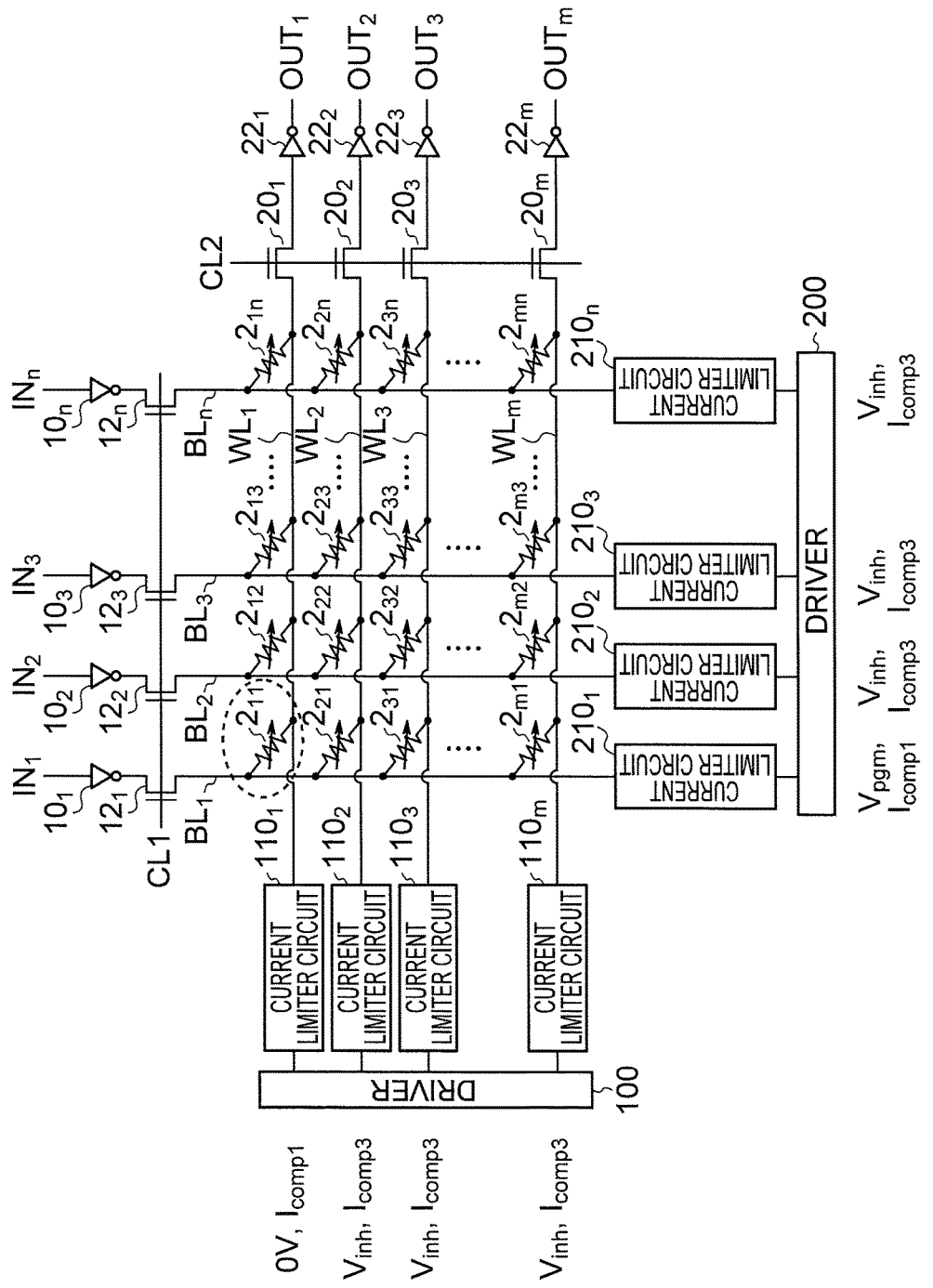
FIG. 11 is a diagram showing an example of voltage application conditions and limited current values during a set operation in the semiconductor integrated circuit according to the embodiment.

The set operation to be described in this example is a set operation to be performed on the resistive change element 2$_{11}$. FIG. 11 is a diagram showing the voltages to be applied and the limited current values according to a first method for performing a set operation on the resistive change element 2$_{11}$.

First, the bit line BL$_1$ and the word line WL$_1$ connected to the resistive change element 2$_{11}$ are selected by the control circuit 300 via the drivers 100 and 200. The program voltage Vpgm is applied to the selected bit line BL$_1$, and the write inhibition voltage Vinh is applied to the unselected bit lines BL$_2$ through BL$_n$ by the driver 200. The write inhibition voltage Vinh should be equal to or lower than the program voltage Vpgm, and is preferably lower than the program voltage Vpgm. Meanwhile, 0 V is applied to the selected word line WL$_1$, and the write inhibition voltage Vinh is applied to the unselected word lines WL$_2$ through WL$_m$ by the driver 100. At this point, the maximum current to pass through the current limiter circuit 210$_1$ is limited to the first current value Icomp1, and the maximum currents to pass through the other current limiter circuits 210$_2$ through 210$_n$ are limited to the third current value Icomp3. Also, the maximum current to pass through the current limiter circuit 110$_1$ is limited to the first current value Icomp1, and the maximum currents to pass through the other current limiter circuits 110$_2$ through 110$_m$ are limited to the third current value Icomp3.

As a result, the program voltage Vpgm is applied between the two terminals of the selected resistive change element 2$_{11}$, and the current to flow between the two terminals is limited to the first current value Icomp1 or lower. Meanwhile, a voltage Vpgm-Vinh is applied between the two terminals of each of the unselected resistive change elements 2$_{i1}$ (i=2, . . . , m), and the current to flow between the two terminals is limited to the third current value Icomp3 or lower. The voltage Vinh is applied between the two terminals of each of the unselected resistive change elements 2$_{1j}$ (j=2, . . . , n), and the current to flow between the two terminals is limited to the third current value Icomp3 or lower. In each of the unselected resistive change elements 2$_{ij}$ (i=2, . . . , m, j=2, . . . , n), 0 V is applied between the two terminals, and the current to flow between the two terminals is limited to the third current value Icomp3 or lower. As described above, the third current value Icomp3 is set at a value equal to or lower than the threshold described with reference to FIG. 8.

Thus, the set operation is performed on the selected resistive change element 2$_{11}$. However, the set operation is not performed on the unselected resistive change elements. That is, a wrong set operation on an unselected resistive change element can be prevented. According to the first method illustrated in FIG. 11, the maximum current in the current limiter circuit 110$_1$ and current limiter circuit 210$_1$ is set at the first current value Icomp1. However, as long as the maximum current flows between two terminals of selected resistive change element 2$_{11}$ is lower than Icomp1, the maximum current either in the current limiter circuit 110$_1$ or in the current limiter circuit 210$_1$ may be set at the second current value Icomp2.

Figure 12:
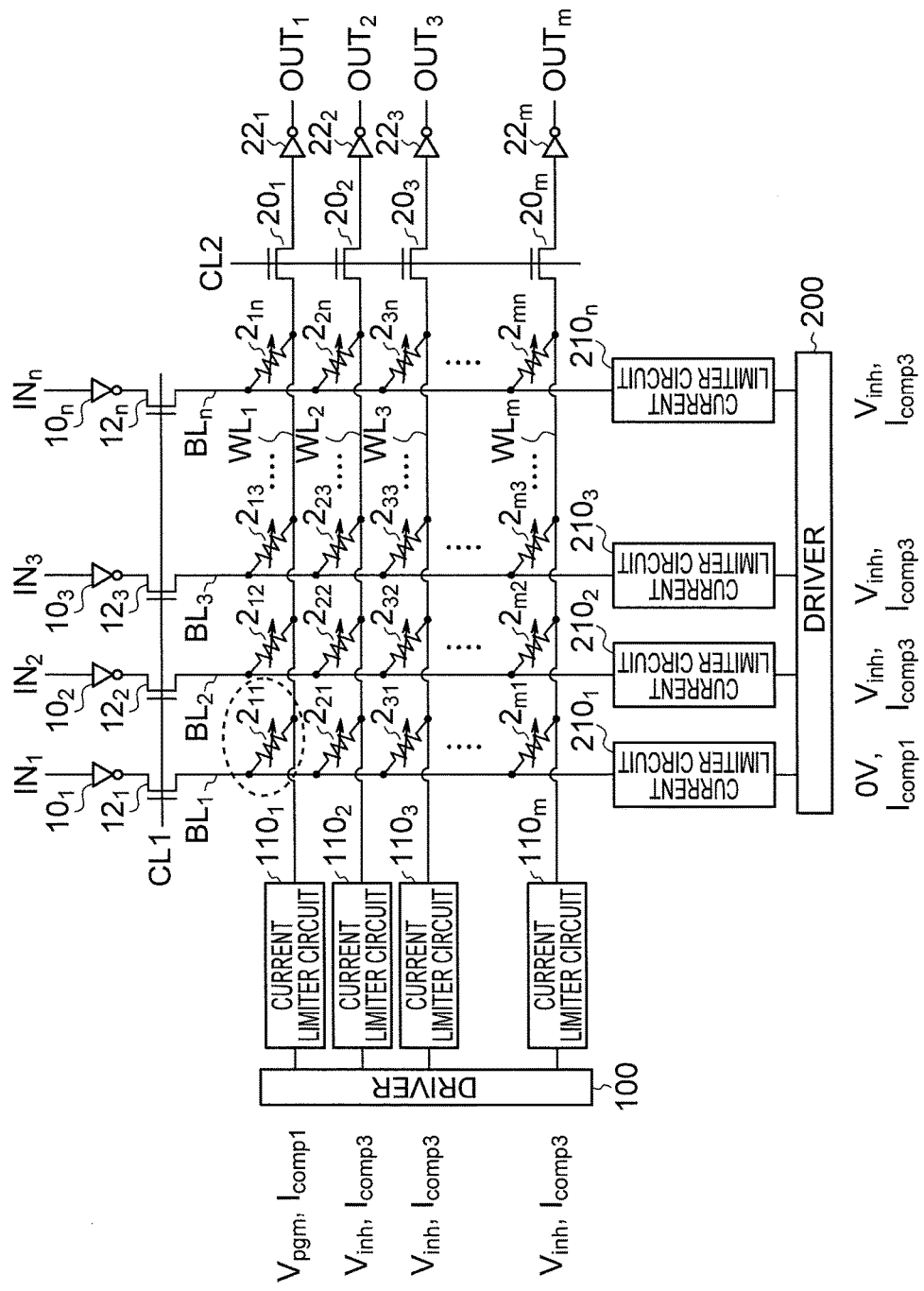
FIG. 12 is a diagram showing another example of voltage application conditions and limited current values during a set operation in the semiconductor integrated circuit according to the embodiment.

Referring now to FIG. 12, a second method for performing a set operation is described. FIG. 12 is a diagram showing the voltages to be applied and the limited current values according to a second method for performing a set operation on the resistive change element 2$_{11}$. The second method differs from the first method described with reference to FIG. 11 in that the voltage to be applied to the bit line BL$_1$ is 0 V, and the voltage to be applied to the word line WL$_1$ is the program voltage Vpgm. The other aspects are the same as those according to the first method. According to the second method illustrated in FIG. 12, the maximum current in the current limiter circuit $210_1$ and the current limiter circuit $110_1$ is set at the first current value Icomp1. However, as long as the maximum current flows between two terminals of selected resistive change element $2_{11}$ is lower than Icomp1, the maximum current either in the current limiter circuit $210_1$ or in the current limiter circuit $110_1$ may be set at the second current value Icomp2.

Figure 13:
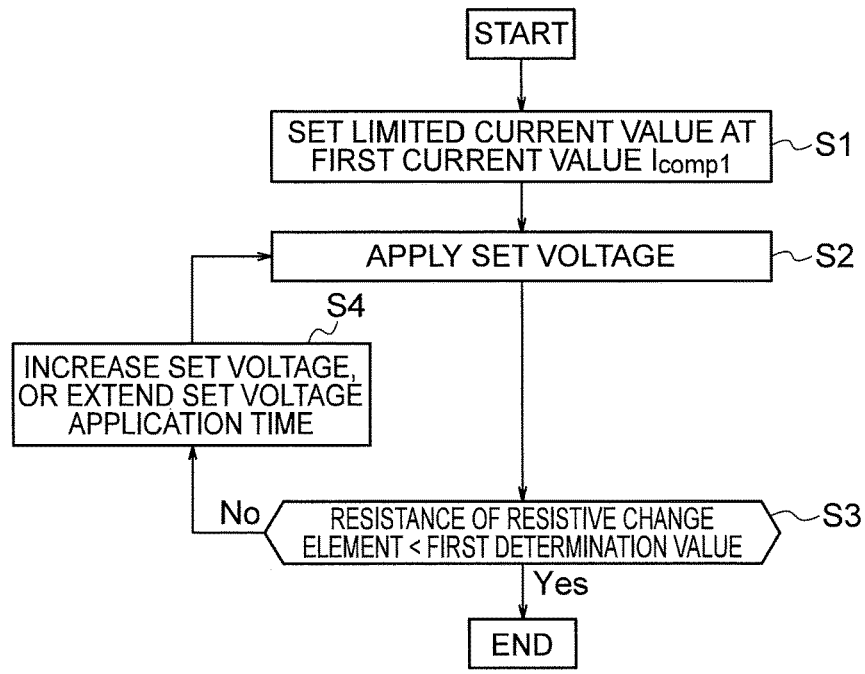
FIG. 13 is a flowchart showing the steps in a set operation in the semiconductor integrated circuit according to the embodiment.

The above described set operation is performed through the steps shown in FIG. 13. First, the limited current value is set at the first current value Icomp1 (S1), and the set voltage is applied to the selected resistive change element 2 (S2). At this point, the maximum current to flow in each unselected resistive change element is set at the third current value Icomp3, as shown in FIG. 11 or 12. The write inhibition voltage Vinh is also applied to each unselected resistive change element.

After that, the resistance of the selected resistive change element 2 is read, and the read value is compared with a first determination value (around 50 kΩ, for example) (S3). If the resistance of the resistive change element 2 is lower than the first determination value, the set operation is ended (S5). If the resistance of the resistive change element 2 is higher than the first determination value, on the other hand, the set voltage is again applied to the resistive change element 2. In this case, a higher voltage than the previously used voltage is used as the set voltage, or the set voltage is applied for a longer time than the previous voltage application time (S4). In this manner, greater stress is applied to the resistive change element 2. After that, the resistance of the resistive change element 2 is again read, and the read value is compared with the first determination value (S3). These steps are repeated until the resistance value of the resistive change element 2 becomes smaller than the first determination value. The above steps are carried out in accordance with a control signal from the control circuit 300 shown in FIG. 1.

(Reset Operation)

Figure 14:
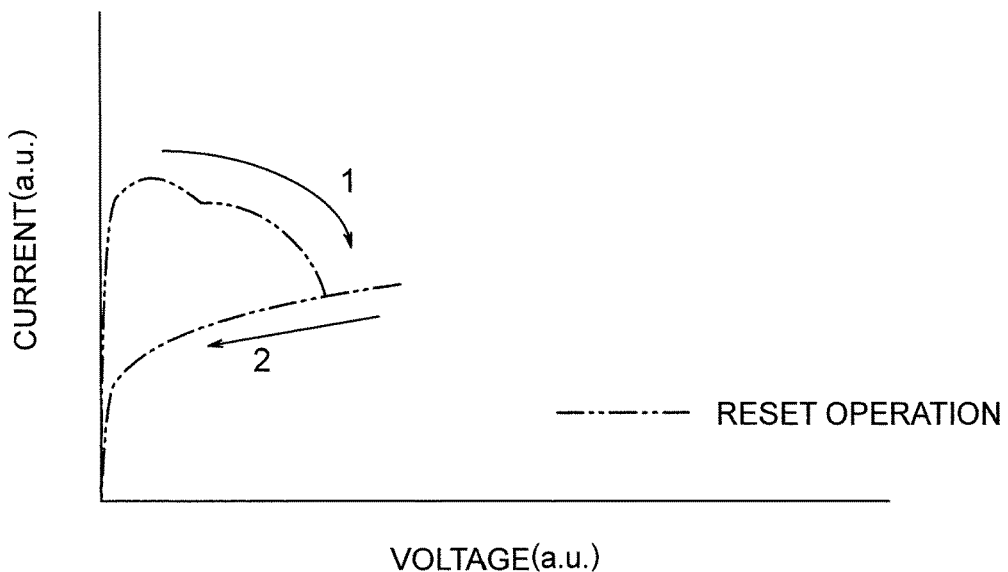
FIG. 14 is a graph showing the current-voltage characteristics at a time of a reset operation on a resistive change element.
Figure 15:
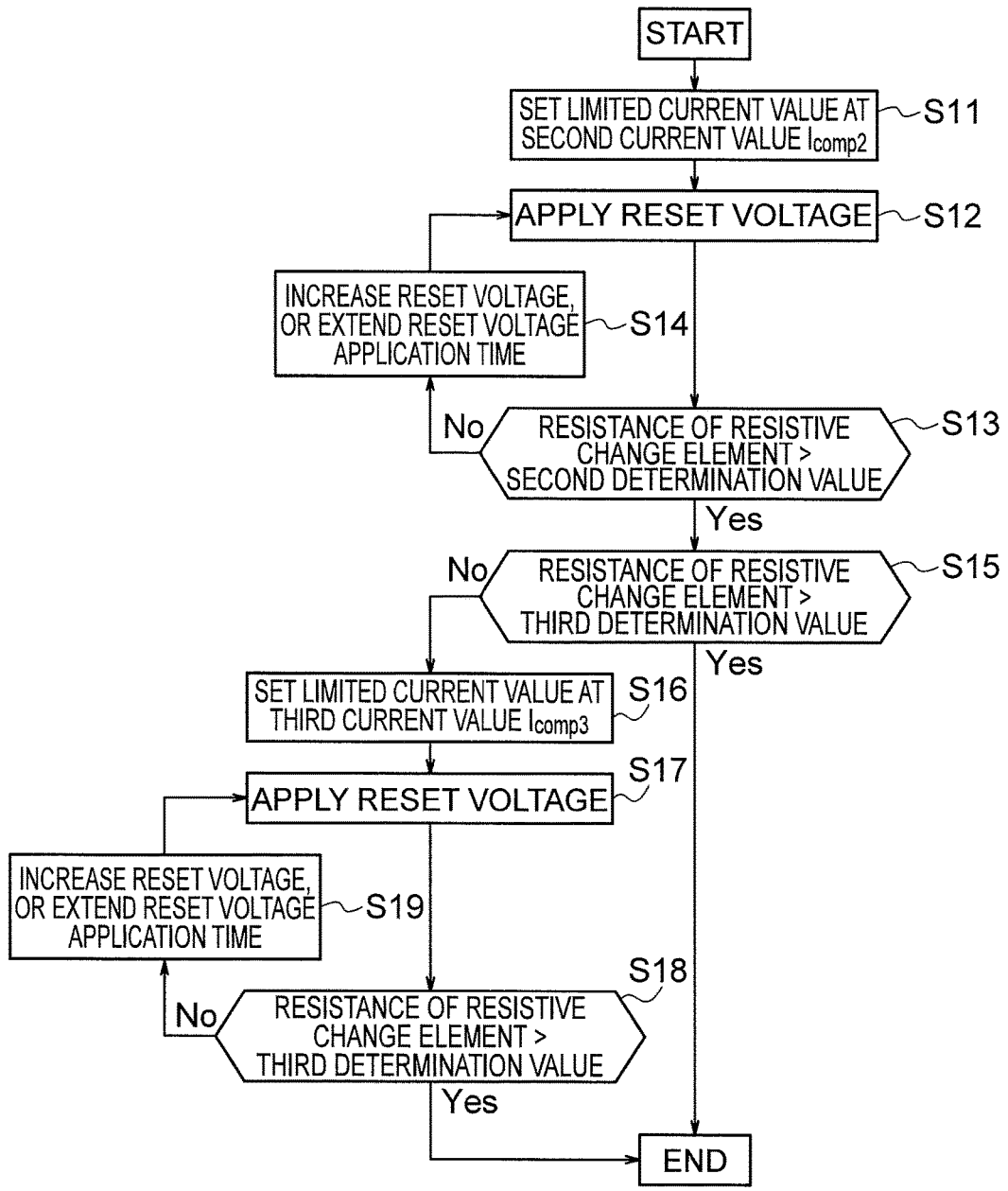
FIG. 15 is a flowchart showing a specific example of the steps in a reset operation in the semiconductor integrated circuit according to the embodiment.

Referring now to FIGS. 14 and 15, a reset operation is described. FIG. 14 shows the current-voltage characteristics at a time of a reset operation on a resistive change element. As the voltage to be applied to the resistive change element is made higher, the current flowing in the resistive change element becomes slightly higher and then becomes lower. After that, the current flowing in the resistive change element is maintained at a low state even if the voltage to be applied is lowered.

FIG. 15 shows specific steps in a reset operation to be performed on a selected resistive change element. First, the maximum current to flow in the selected resistive change element is set at a value equal to or lower than the second current value Icomp2 (S11), and the reset voltage is applied to the selected resistive change element (S12). At this point, the maximum current to flow in each unselected resistive change element is set at the third current value Icomp3, as in a set operation. The write inhibition voltage Vinh is also applied to each unselected resistive change element. The write inhibition voltage Vinh should be equal to or lower than the reset voltage, and is preferably lower than the reset voltage. After that, the resistance of the resistive change element is read, and the read value is compared with a second determination value (around 1 MΩ, for example) (S13). If the resistance of the resistive change element is equal to or lower than the second determination value, the reset voltage is again applied to the resistive change element. In this case, a higher voltage than the previously used voltage is used as the reset voltage, or the reset voltage is applied for a longer time than the previous voltage application time (S14). In this manner, greater stress is applied to the resistive change element. After that, the resistance of the resistive change element is again read, and the read value is compared with the second determination value. Steps S13, S14, and S12 are repeated until the resistance value of the resistive change element becomes higher than the second determination value.

If the resistance of the resistive change element is higher than the second determination value, on the other hand, the resistance is compared with a third determination value (around 1 GΩ, for example) (S15). If the resistance of the resistive change element is higher than the third determination value, the reset operation is ended. If the resistance of the resistive change element is equal to or lower than the third determination value, the limited current value is set at the third current value Icomp3, and the reset voltage is applied (S16, S17). After that, the resistance of the resistive change element is read, and the read value is compared with the third determination value (S18). If the resistance of the resistive change element is equal to or lower than the third determination value, the reset voltage is again applied to the resistive change element.

In this case, a higher voltage than the previously used voltage is used as the reset voltage, or the reset voltage is applied for a longer time than the previous voltage application time (S19). In this manner, greater stress is applied to the resistive change element. After that, the resistance of the resistive change element is again read, and the read value is compared with the third determination value. Steps S18, S19, and S17 are repeated until the resistance value of the resistive change element becomes higher than the third determination value.

It should be noted that the above steps are carried out in accordance with a control signal from the control circuit 300 shown in FIG. 1.

According to the steps in the above described reset operation, if the resistance of the resistive change element is equal to or lower than the third determination value, the limited current value is set at the third current value Icomp3, and the reset operation is repeated. Thus, the reliability of the reset operation can be increased.

(Read Operation)

Referring back to FIG. 1, a read operation in the semiconductor integrated circuit of this embodiment is described. When a read operation is performed, the current limiter circuits $110_1$ through $110_m$ and the current limiter circuits $210_1$ through $210_n$ are put into an off-state by the control circuit 300. Meanwhile, the cutoff transistors $12_1$ through $12_n$ and the cutoff transistors $20_1$ through $20_m$ are put into an on-state by the control circuit 300. In this state, input signals $IN_1$ through $IN_n$ are input to the input terminals of the inverters $10_1$ through $10_n$, respectively, and output signals $OUT_1$ through $OUT_m$ are then output from the output terminals of the inverters $22_1$ through $22_m$. In the semiconductor integrated circuit of this embodiment, at least one resistive change element among the n resistive change elements $2_{1j}$ (j=1, . . . , n) connected to the same word line, which is the word line $WL_1$, is in a low-resistance state, and the other resistive change elements are in a high-resistance state. As the input signals $IN_1$ through $IN_n$ are input in such a state, the output signals $OUT_1$ through $OUT_m$ corresponding to the information stored in the resistive change elements of the memory cell 1 are output.

Comparative Example

Figure 16:
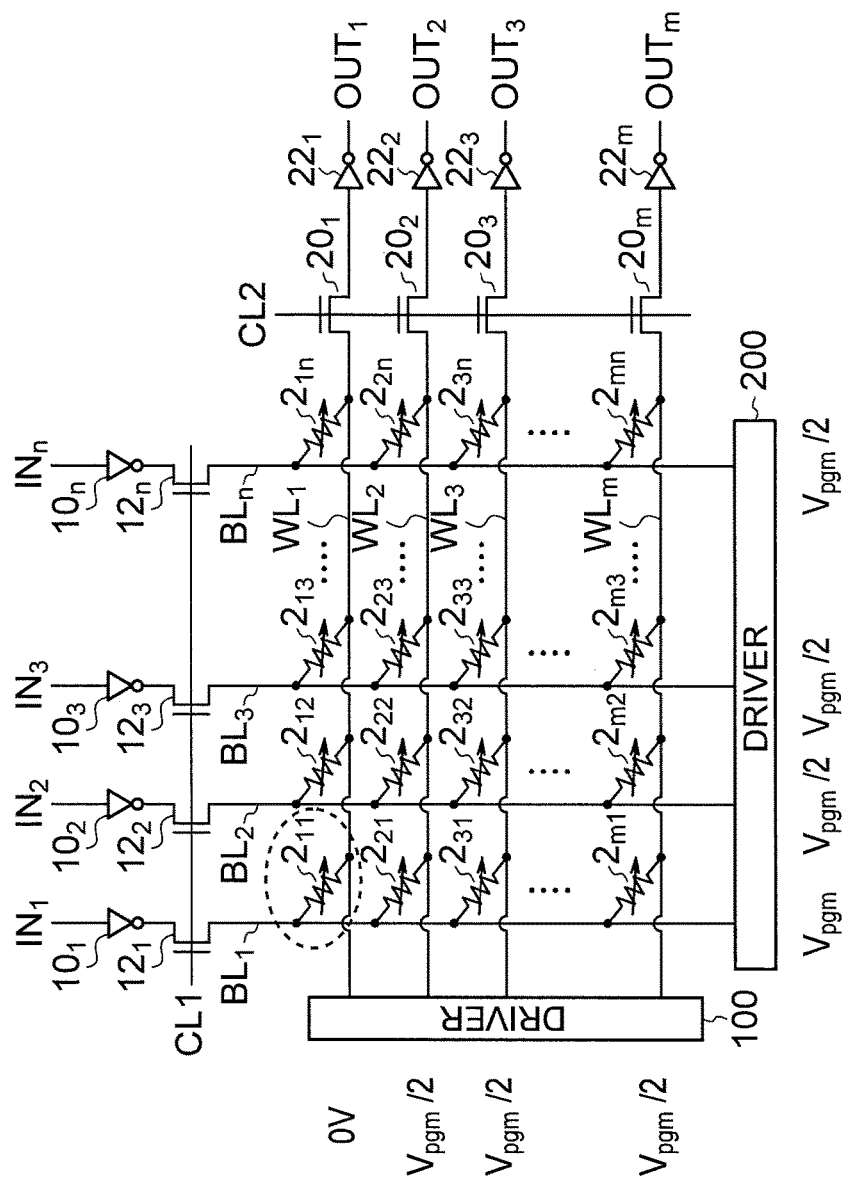
FIG. 16 is a circuit diagram showing a semiconductor integrated circuit of a comparative example.

FIG. 16 shows a semiconductor integrated circuit of a comparative example. The semiconductor integrated circuit of this comparative example has the same configuration as the semiconductor integrated circuit of this embodiment shown in FIG. 1, except that the current limiter circuits $110_1$ through $110_m$ and the current limiter circuits $210_1$ through $210_n$ are removed.

An example of the voltage application conditions in a case where a set operation is performed on the resistive change element $2_{11}$ in the semiconductor integrated circuit of this comparative example is shown in FIG. 16. First, 0 V is applied to the bit line $BL_1$, and the program voltage Vpgm is applied to the word line $WL_1$ so that a set operation is performed on the resistive change element $2_{11}$. At this point, a voltage Vpgm/2 is applied to each of the bit lines $BL_2$ through $BL_n$, and the voltage Vpgm/2 is also applied to each of the word lines $WL_2$ through $WL_m$.

As a result, the selected resistive change element $2_{11}$ is set, and the unselected resistive change elements can be protected from program disturb (set disturb or reset disturb). In a case where resistive change elements with large set voltage variation are used, however, program disturb might occur, as described above with reference to FIG. 3.

In this embodiment, on the other hand, the currents to flow in the word lines and the bit lines during a set operation and a reset operation are limited. Thus, the occurrence of program disturb can be prevented.

As described above, according to this embodiment, the occurrence of program disturb can be prevented.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
a plurality of first wiring lines;
a plurality of second wiring lines intersecting with the respective first wiring lines;
a plurality of resistive change elements disposed in intersection regions between the first wiring lines and the second wiring lines, the resistive change elements each including a first electrode connected to corresponding one of the first wiring lines, a second electrode connected to corresponding one of the second wiring lines, and a resistive change layer disposed between the first electrode and the second electrode, a resistance state between the first electrode and the second electrode being switchable by programming from one of a first resistance state and a second resistance state to the other one of the first resistance state and the second resistance state, the second resistance state having a greater resistance value than the first resistance state;
a first driver configured to drive the first wiring lines;
a second driver configured to drive the second wiring lines;
a control circuit configured to control the first and second drivers;
a plurality of first current limiter circuits corresponding to the first wiring lines, each of the first current limiter circuits being configured to limit a maximum current flowing in corresponding one of the first wiring lines to a value not greater than one of a first current value, a second current value, and a third current value in accordance with a control signal from the control circuit, the second current value being greater than the first current value, the third current value being smaller than the first current value; and
a plurality of second current limiter circuits corresponding to the second wiring lines, each of the second current limiter circuits being configured to limit a maximum current flowing in corresponding one of the second wiring lines to a value not greater than one of the first current value, the second current value, and the third current value in accordance with a control signal from the control circuit,
wherein the control circuit controls the first and second drivers and selects one of the first wiring lines and one of the second wiring lines from among the first and second wiring lines to select one of the resistive change elements corresponding to the one of the first wiring lines and the one of the second wiring lines from the resistive change elements, and, when switching the one of the resistive change elements from the second resistance state to the first resistance state by programming, sends a control signal to the first current limiter circuits to limit a current flowing in the selected first wiring line to a value not greater than the first current value and limit a current flowing in the unselected first wiring lines to a value not greater than the third current value, and sends a control signal to the second current limiter circuits to limit a current flowing in the selected second wiring line to a value not greater than the first current value and limit a current flowing in the unselected second wiring lines to a value not greater than the third current value.

2. The semiconductor integrated circuit according to claim 1, wherein, when switching the one of the resistive change elements from the second resistance state to the first resistance state by programming, the control circuit performs a first write by further controlling the first and second drivers to apply a first voltage between the first electrode and the second electrode of the selected resistive change element, and apply a second voltage to each of the unselected first wiring lines and the unselected second wiring lines, the second voltage being not higher than the first voltage.

3. The semiconductor integrated circuit according to claim 2, wherein, after performing the first write, the control circuit measures a first value of a resistance of the one of the resistive change elements, and, when the first value is not smaller than a first determination value, again performs the first write by applying a voltage between the first electrode and the second electrode of the selected resistive change element, the voltage being higher than the first voltage applied at the time of the first write, or making an application time of the first voltage longer than the application time during the first write.

4. The semiconductor integrated circuit according to claim 1, wherein, when switching the selected resistive change elements from the first resistance state to the second resistance state by programming, the control circuit limits a current flowing in the selected first wiring line and the selected second wiring line to a value not greater than the second current value and limit a current flowing in the unselected first wiring lines and the unselected second wiring lines to a value not greater than the third current value by sending a control signal to the first current limiter circuits and the second current limiter circuits, and performs a second write by applying a third voltage between the first electrode and the second electrode of the selected resistive change element and applying a fourth voltage to each of the unselected first wiring lines and the unselected second wiring lines, the fourth voltage being not higher than the third voltage.

5. The semiconductor integrated circuit according to claim 4, wherein, after performing the second write, the control circuit measures a second value of a resistance of the selected resistive change element, and, when the second value is not greater than a second determination value, again performs the second write by applying a voltage between the first electrode and the second electrode of the selected resistive change element, the voltage being higher than the third voltage applied at the time of the second write, or making an application time of the third voltage longer than the application time during the second write.

6. The semiconductor integrated circuit according to claim 5, wherein, when the second value is greater than the second determination value, the control circuit compares the second value with a third determination value greater than the second determination value, and, when the second value is greater than the third determination value, ends the second write.

7. The semiconductor integrated circuit according to claim 6, wherein, when the second value is not greater than the third determination value, the control circuit limits the current flowing in the selected resistive change element to a value not greater than the third current value, applies the third voltage between the first electrode and the second electrode of the one of the resistive change elements, measures a third value of a resistance of the selected resistive change element, and, when the third value is greater than the third determination value, ends the second write.

8. The semiconductor integrated circuit according to claim 7, wherein, when the second value is not greater than the third determination value after the second write is performed, the control circuit again performs the second write by applying a voltage between the first electrode and the second electrode of the selected resistive change element, the voltage being higher than the third voltage applied at the time of the second write, or making the application time of the third voltage longer than the application time during the second write.

9. The semiconductor integrated circuit according to claim 1, wherein the first current limiter circuits are disposed between the first wiring lines and the first driver, and the second current limiter circuits are disposed between the second wiring lines and the second driver.

* * * * *